United States Patent [19]

Lee et al.

[11] Patent Number: 4,798,978
[45] Date of Patent: Jan. 17, 1989

[54] GAAS FET LOGIC HAVING INCREASED NOISE MARGIN

[75] Inventors: Gary M. Lee, High Bridge; Charles M. Lee, Murray Hill; George S. LaRue, Flemington, all of N.J.

[73] Assignee: Gain Electronics Corporation, Somerville, N.J.

[21] Appl. No.: 44,519

[22] Filed: Apr. 30, 1987

[51] Int. Cl.$^4$ ........................................ H03K 19/094
[52] U.S. Cl. ................................. 307/450; 307/443; 307/448; 307/475
[58] Field of Search ............... 307/443, 448, 450, 475, 307/581, 264

[56] References Cited

U.S. PATENT DOCUMENTS

| | | | |
|---|---|---|---|
| 4,093,925 | 2/1978 | Yokoyama | 307/270 X |
| 4,300,064 | 5/1981 | Eden | 307/450 X |
| 4,394,589 | 9/1983 | Pham et al. | 307/450 |
| 4,405,870 | 9/1983 | Eden | 307/450 X |
| 4,471,238 | 1/1984 | Hickling et al. | 307/450 |
| 4,490,632 | 12/1984 | Everett et al. | 307/448 X |
| 4,514,649 | 4/1985 | Nuzillat et al. | 307/450 |
| 4,661,726 | 4/1987 | Biard | 307/448 X |
| 4,697,110 | 9/1987 | Masuda et al. | 307/448 X |

FOREIGN PATENT DOCUMENTS 0002156  1/1977  Japan ..................... 307/450

OTHER PUBLICATIONS

Steven L. Long et al., "High Speed GaAs Integrated Circuits", Proc. of the IEEE, vol. 70, No. 1, Jan. 1982.
K. Suyama et al., "Design and Performance of GaAs . . . .", Proc. of the IEEE on El. ev. vol. ED27, No. 6, Jun. 1980.
Lehovec et al, "Analysis of GaAs FET's for Integrated Logic", *IEEETELD*, vol. ED-27, No. 6, 6-1980, pp. 1074-1091.

Primary Examiner—Stanley D. Miller
Assistant Examiner—D. R. Hudspeth
Attorney, Agent, or Firm—Marmorek, Guttman & Rubenstein

[57] ABSTRACT

A high performance logic family for GaAs Enhancement/Depletion mode MESFETs is disclosed. The inventive logic family exhibits a large noise margin with little sacrifice in speed/power performance.

12 Claims, 3 Drawing Sheets

GAAS FET LOGIC HAVING INCREASED NOISE MARGIN

FIELD OF THE INVENTION

This invention relates to the field of solid state electronic circuits and more particularly to a high performance logic family which may be implemented using GaAs enhancement and depletion (E/D) mode metal semiconductor field effect transistors (MESFETs).

BACKGROUND OF THE INVENTION

GaAs technology has been in use for many years, but has not achieved commercial viability. A few select applications where performance is the important issue have been addressed. However, widespread acceptance of GaAs technology depends upon price and therefore yield. The yield of GaAs integrated circuits suffers from the small noise margins of presently available GaAs E/D MESFET logic families, as compared to silicon logic families. The small noise margin of presently available GaAs logic families does not allow for enough process variations in the manufacture of GaAs integrated circuits. Drastic yield reductions are especially observed at Large Scale Integration (LSI) levels.

Noise margin of a logic circuit may be defined as the extraneous signal voltage amplitude that can be added algebraically to the noise free worst-case input level before the output voltage deviates from the desired level. Simply put, if a logic gate has too low a noise margin, it will be highly susceptible to unintentional switching by spurious noise signals.

The voltage swing for digital logic circuits (i.e., the swing between the logic "0" voltage and the logic "1" voltage must be large enough to tolerate process variations, temperature effects, and real circuit conditions (such as bus drops, fan in and fan out) and still have sufficient noise margin to tolerate voltage degradations from capacitive coupling, resistive coupling, or radiation.

The simplest GaAs FET logic family that employs both depletion and enhancement mode MESFETs is Direct Coupled FET Logic (DCFL). A DCFL inverter may be implemented using an enhancement mode (i.e., normally off) GaAs MESFET whose source terminal is connected to ground and whose gate terminal receives the input signal. This FET serves as the driver for the inverter. A load is connected between a voltage source $V_{DD}$ and the drain terminal of the driver MESFET. The signal output of the inverter is taken at the drain terminal of the driver MESFET. A depletion mode (i.e., normally on) MESFET is used as an active non-linear load element. The drain of the load FET is connected to the voltage source $V_{DD}$ and the source of the load FET is connected to the drain of the driver FET. The gate of the load FET is tied to its source. Typically, $V_{DD}$ is about 1 Volt for DCFL.

In the inverter described above, when the voltage on the gate of the driver FET is low (i.e., logic "0") the driver FET is not conducting and its drain (i.e, the output terminal) is "pulled up" to the high voltage value by the load. When the voltage on the gate of the driver FET is high (i.e, logic "1") the driver is conducting and its drain terminal is "pulled down" to the low voltage value.

Circuits other than an inverter may be realized in DCFL. For example, a two input NOR gate is obtained by connecting a second enhancement-mode driver FET in parallel with the first driver FET. In this case, if the gate of either or both driver FETS is high, the output is low. If the gates of both driver FETs are low, tee output is high. Similarly, a two input NAND gate may be formed by connecting a second driver FET in series with the first driver FET.

For the DCFL logic family, the logic "0" voltage value is about 0.2 Volts. However the logic "1" voltage value is only about 0.7 volts. Thus, the voltage swing between the logic "0" and logic "1" voltage values is only about 50% of the supply voltage $V_{DD}$, which, as indicated above, has a value of about 1 volts. The limit on the logic "high" voltage value occurs because of the Schottky barrier diode between the gate and source terminals of the enhancement mode driver MESFET of the DCFL gate. When this intrinsic diode is forward biased its voltage drop is 0.7 volts.

The biggest drawback of DCFL is in its low noise margin. The threshold voltage for switching a typical GaAs enhancement mode MESFET is about 200 millivolts. Similarly, the threshold voltage for switching a DCFL gate is about 400 millivolts depending on the relative dimensions of the enhancement and depletion mode driver and load MESFETs. This gives DCFL a nominal noise margin which is insufficient to overcome process variations, temperatures effects, real circuit conditions (such as bus drops, fan in and fan out) and voltage degradations resulting from capacitative coupling, resistive coupling or radiation.

A number of modifications have been proposed to overcome the low noise margin of the DCFL logic family. In one such logic family, known as Enhancement/Depletion Buffered FET Logic (E/D BFL), the threshold for switching the basic DCFL inverter is increased by placing a Schottky barrier diode in series between the enhancement mode driver FET source terminal and ground, thereby increasing the effective switching threshold voltage by the voltage drop of the added diode. However, this diode merely serves to level shift the high and low voltage levels. The high (i.e., logic "1") voltage level is about 1.4 volts or twice the voltage drop of a Schottky barrier diode and the low (i.e., logic "0") voltage level is about 0.7 volts or equal to the voltage drop of one Schottky barrier diode. For this reason a source follower stage is used as an output stage for the E/D BFL gate. E/D BFL provides a noise margin slightly better than DCFL.

Illustratively, the source follower stage comprises an enhancement mode MESFET whose gate terminal is connected to the output of the inverter stage, whose drain terminal is connected to a voltage supply, and whose source terminal is connected to a load. The source of the enhancement mode FET forms the output of the source follower stage. Illustratively, the load may be a depletion mode MESFET whose source is tied to its gate. The drain of the depletion load MESFET is connected to the source of the enhancement mode MESFET and the source of the depletion mode load MESFET is connected to ground.

In an alternative prior art family of logic known as Low Pinch-Off FET LOGIC (LPFL), instead of modifying the basic DCFL inverter by connecting a Schottky barrier diode between the source terminal of the driver FET and ground, an improved noise margin may be achieved by placing a diode in the source follower stage so that its anode is connected to the source of the enhancement mode FET and its cathode is connected to the drain of the depletion mode load FET. The output is taken at the cathode of the diode.

However, the foregoing logic families suffer from a number of substantial shortcomings. First, DCFL, E/D BFL and LPFL all have output voltage swings equal to about 60% or less of the supply voltage $V_{DD}$. Furthermore, the E/D BFL and LPFL logic families utilize a source follower in the output stage which constantly draws DC power even when not required to charge interconnect capacitances. Lastly, for DCFL, large input FETS must be used which add extra input capacitance and can make the circuit area larger than other prior art circuits such as the two stage circuits of the E/D BFL and LPFL families even though DCFL has fewer components.

Accordingly, it is an object of the present invention to provide a new family of GaAs logic which overcomes the foregoing shortcomings and which provides fast switching speed and lower power dissipation. More particularly, it is an object of the present invention to provide a high performance logic family which may be implemented using enhancement and depletion mode GaAs MESFETs, which logic family achieves a large noise margin without the penalties of high power dissipation or long switching delays.

SUMMARY OF THE INVENTION

The present invention is a high performance logic family implemented using enhancement and depletion mode GaAs MESFETs.

In the inventive logic family, a NOR-gate is formed by utilizing source-follower OR logic at the front end of a conventional inverter stage. The source follower OR logic comprises a plurality of enhancement mode FETs having gate terminals adapted to receive logical input signals, drain terminals connected to a voltage supply $V_{DD}$ and a common source terminal. The voltage of the common source terminal is pulled up if any of the input signals is high and is pulled down if all of the input signals are low. A depletion mode FET is provided for level shifting the voltage present at the common source terminal. The level shifted output of the source follower OR logic is transmitted to the gate of the enhancement mode driver FET in the inverter. The level shifting MESFET has its source tied to its gate. The dimensions of the level shifting MESFET may be adjusted to produce a desired amount of level shifting so as to adjust the noise margin of the NOR gate to a certain level. The inventive NOR gate dissipates power only for 50% of the duty cycle. A push-pull stage is used to drive larger capacitive loads while maintaining high switching speeds. The push-pull stage dissipates virtually zero D.C. power.

In accordance with the present invention, a multiple input AND gate may be implemented as follows. A depletion mode MESFET is arranged with its drain connected to the voltage supply VDD and its source tied to its gate. Each logic input to the multiple input AND gate has a diode (more particularly, a Schottky barrier diode) associated with it. The cathode of each diode receives the input signal and the anode of each diode is connected to the source terminal of the depletion mode FET. If all of the logic inputs are high, all of the diodes are reversed biased and the source terminal of the depletion mode FET is "pulled up" to the supply voltage $V_{DD}$. If any of the logical inputs is low, the corresponding diode will be forward biased and the source of the depletion mode FET will be "pulled down" toward ground.

One important advantage of this AND gate is that it is well suited for a relatively large number of inputs. In contrast, in many prior art logic families, AND gates re formed by connecting multiple driver FETs in series. In such families, including DCFL, it is difficult to form an AND gate having more than two inputs. In the AND gate of the present invention, parallel-connected diodes are used so that multiple inputs in excess of two are easily achieved. In addition the Schottky barrier diode is a minimum geometry component so that the inventive AND gate may be combined with other circuit components to implement more complex logic functions with relatively small cell areas.

Preferably, the output from one or more of such AND gates may be connected to the inputs of a NOR gate (i.e., an OR-INVERT gate) similar to the one discussed above. The reason for this is that the output voltage of the AND gate, standing alone, does not have sufficient noise margin or drive strength for LSI interconnections. However, in this case, the source follower input section of the NOR gate includes a Schottky barrier diode for level shifting, rather than a depletion mode MESFET. This helps insure that the NOR gate and the combined AND-OR-INVERT gate discussed above have the same noise margins. This is important as numerous gates are generally connected in sequence to implement complex functions. More particularly, the dimensions of the level shifting MESFET in the NOR gate may be adjusted so that the two gates have matching transfer characteristics and substantially the same noise margin. The AND-OR-INVERT gate may be followed by a push-pull stage which adds virtually zero D.C. power.

The above described logic family has a number of significant advantages. First, the output voltage swing between the logic "1" level and logic "0" level is about 90% of the voltage supply $V_{DD}$. In contrast, such logic families as DCFL, E/D BFL and LPFL have swings that are 60% or less of the voltage supply making them less efficient. In addition, a push-pull output stage can be added to the inventive logic gates with minimal area allowing circuit densities comparable to DCFL. The inventive logic family uses small devices for the input stage which take up little area, have low input capacitance and operate with low current. Circuits such as E/D BFL and LPFL have the source follower in the output stage whereby large currents are constantly drawn to charge the interconnect capacitances leading to high power dissipation.

The inventive logic family achieves nominal noise margins of about 700 mV. This outstanding noise margin is achieved without the penalties of high power dissipation or long gate delay. The very high noise margin of the gates comprising the inventive logic family make these gates excellent building blocks for GaAs Large Scale Integrated (LSI) circuits, especially for LSI circuits that require high switching speed and low power dissipation.

DETAILED DESCRIPTION OF THE INVENTION

Figure 1:
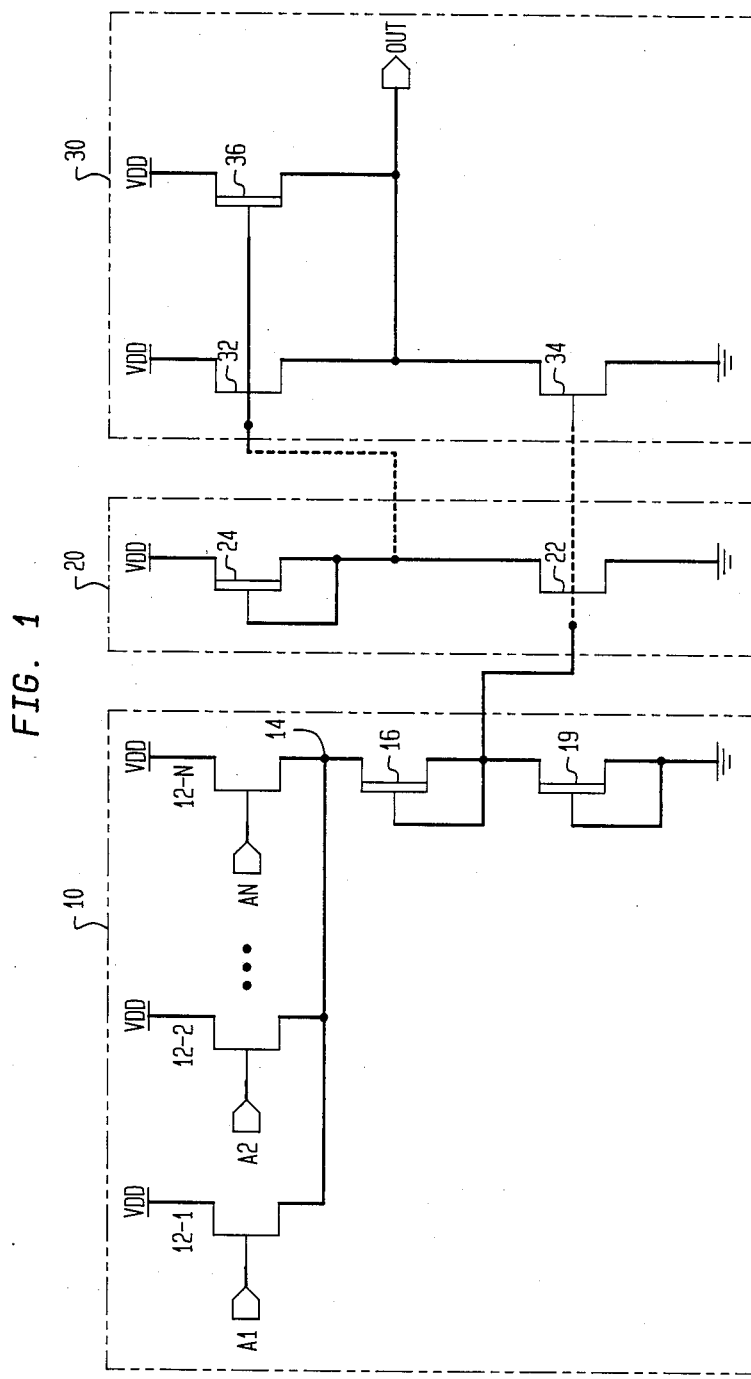
FIG. 1 shows a multiple input NOR gate implemented using GaAs enhancement mode and depletion mode MESFET in accordance with an illustrative embodiment of the invention.

Turning to FIG. 1, a multiple input NOR-gate is illustrated. The NOR-gate has N inputs designated A1, A2 . . . AN respectively. The output of this circuit is logic "0" if any or all of the inputs are logic "1" and the output is logic "1" when all of the inputs are logic "0".

The logic gate of FIG. 1 comprises an input stage 10 which comprises source follower "OR" logic. Each of the inputs A1, A2 . . . AN is connected to the gate terminal of a corresponding enhancement mode GaAs MESFET designated 12-1, 12-2 . . . 12-N, respectively. The drain terminal of each of these FETs is connected to the voltage supply $V_{DD}$ which illustratively is about two volts. The source terminals of each of the FETs 12-1, 12-2 . . . 12N are connected together to form a common source 14. If all of the inputs are logic "0", all of the input FETS 12-1, 12-2...12-N are non-conducting (i.e., turned off) and the common source 14 is pulled down to a low voltage level. If any of the inputs is logic "1" the voltage at the common source 14 is pulled up to a high voltage level.

The MESFET 16 serves as a level shifter which level shifts the voltage appearing at the common source terminal 17 when one of the enhancement mode FETs 12-1, 12-2 . . . 12-N in the input stage 10 is conducting. The second depletion mode MESFET 19 serves as a current source for discharging the intrinsic Schottky gate capacitance of the driver FET in the inverter stage 20.

The inverter stage 20 comprises an enhancement mode driver MESFET 22 whose source is connected to ground, whose gate receives a signal from the source of the level shifting depletion mode MESFET 16 and whose drain is connected to the source of a depletion mode MESFET 24. The depletion mode MESFET 24 serves as a load for the inverter stage. Its source is connected to its gate and its drain is connected to the voltage supply $V_{DD}$. The inverter stage 20 serves to invert the output of the source follower OR logic 10 after level shifting to form a NOR-gate. The output of the NOR gate is the drain terminal of the driver MESFET 22.

With respect to FIG. 1, if there is only one input A1 and only one input FET 12-1, the gate of FIG. 1 is an inverter rather than NOR gate.

Figure 2:
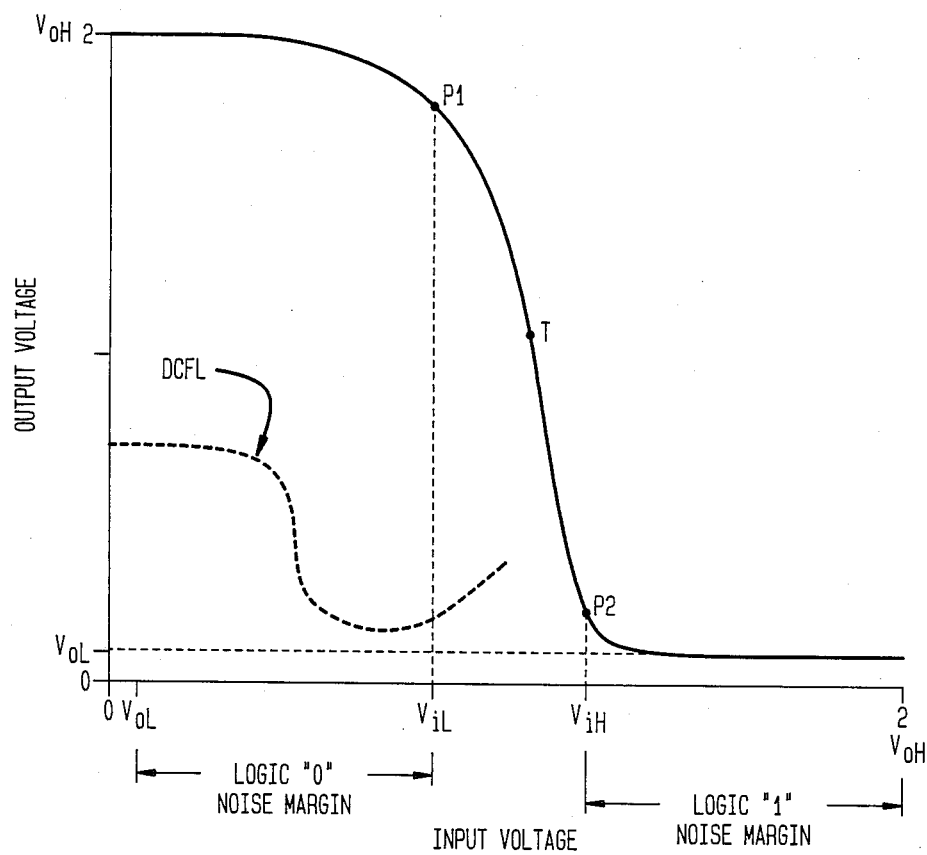
FIG. 2 illustrates the transfer characteristic of the inventive logic gate of FIG. 1.

FIG. 2 shows the transfer characteristics of such an inverter (solid curve). For purposes of comparison, the transfer characteristic of a conventional DCFL inverter is also shown in FIG. 2 (phantom curve).

As can be seen from the solid curve in FIG. 2, when the input voltage is low (i.e. logic "0") the output voltage is high (logic "1"), and when the input voltage is high (i.e., logic "1") the output voltage is low (i.e., logic "1"). The voltage swing between high and low is about 90% of the supply voltage $V_{DD}$.

For purposes of analysis, it is useful to define two unit gain points designated P1 and P2 in FIG. 2. Point P1 is the upper unit gain point and point P2 is the lower unit gain point. At both points P1 and P2 the transfer characteristic curve has a negative slope of unity. The transition region is the input voltage range between the points P1 and P2. In the transition region neither the logic high nor the logic low voltage level is valid. In general, the narrower the transition region, the wider the regions for valid logic levels. A third point, designated T in FIG. 2, corresponds to the threshold voltage for switching the gate.

It is also possible to define several other voltages of interest.

$V_{oH}$ is the minimum voltage which will be available at the logic gate output when the output is supposed to be at logic "1".

ViH is the minimum input voltage which will unambiguously be acknowledged by the gate as corresponding to logic "1" (corresponds to the lower unit gain point).

$V_{oL}$ is the maximum voltage which will appear at a logic gate output when the output is supposed to be at logic "0".

$V_{iL}$ is the maximum gate input voltage which will unambiguously be acknowledged by the gate as corresponding to logic "0" (corresponding to the upper unit gain point).

These voltages are indicated in FIG. 2 in connection with the transfer characteristic of the inventive logic gate. The logic "0" noise margin is defined as $V_{iL}$ — $V_{oL}$. The logic "1" noise margin is defined as $V_{oH}$ — $V_{iH}$. The noise margins are indicated in FIG. 2.

As can be seen by looking at the two transfer characteristics shown in FIG. 2, the noise margins for the inventive logic gate are significantly larger than the noise margins for the conventional DCFL gate. More particularly, the noise margins for the inventive gate are about 700 mV.

Physically, the increased noise margins result from an increased value for the logic "1" voltage value and from the increased switching threshold voltage (point T in FIG. 2). The logic "1" voltage value for the gate of FIG. 2 arises from the sum of:

1. the voltage drop of the Schottky barrier diode between the gate and source terminals of the MESFET 22

2. the drain to source voltage of the depletion mode MESFET 16

3. the voltage drop of the Schottky barrier diode between the gate and source terminals of the appropriate input MESFETs 12-1, 12-2 . . . 12-N.

In order to switch the state of the signal at the drain terminal of the MESFET 22, an input signal must be large enough (i.e., the switching threshold voltage must be large enough) to exceed the sum of:

1. the threshold voltage for switching the corresponding enhancement mode input MESFETs 12-1, 12-2 . . . 12-N.

2. the voltage between the drain and source terminals of the depletion mode level shifting FET 16, and 3. the threshold voltage for switching the inverter stage 20.

In order to reduce power dissipation when driving large capacitative loads, a push-pull stage 30 may be connected at the output of the inverter stage 20. The push-pull stage comprises two enhancement mode MESFETs 32 and 34. The gate of the MESFET 32 is connected to the source of the depletion mode MESFET 24 and the gate of the MESFET 34 is connected to the gate of the enhancement mode driving MESFET 22 in the inverter stage 20. The connections to the push pull stage 30 are illustrated in phantom in FIG. 1. In addition, an additional depletion mode MESFET 36 may be provided to provide additional "pull up" when the enhancement mode FET 32 stops conducting. The drain terminal of the depletion mode MESFET 36 is connected to the voltage supply $V_{DD}$, its gate is connected with the gate of FET 32 and its source is connected with the drain of the enhancement depletion mode MESFET 34.

Figure 3:
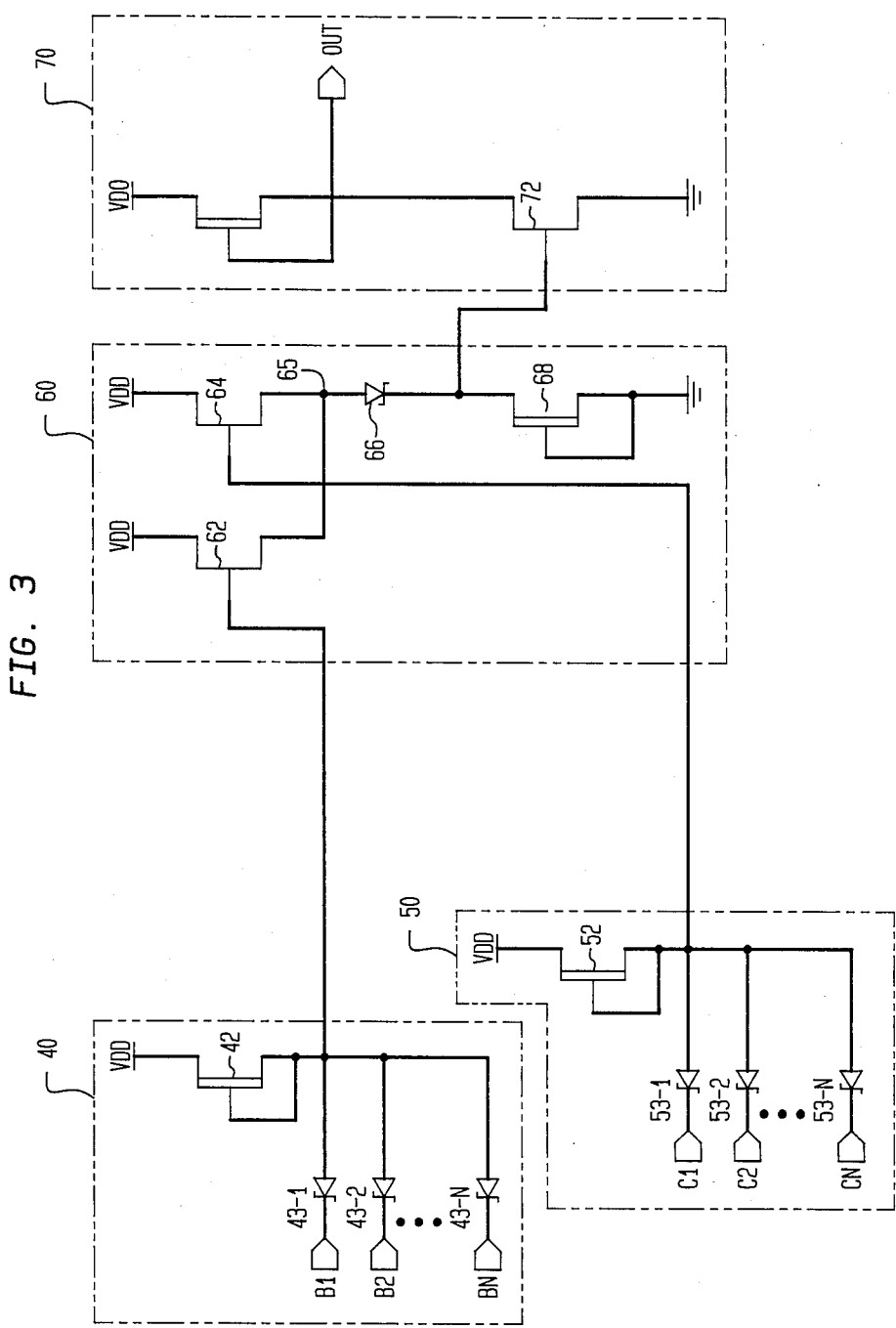
FIG. 3 illustrates an AND-OR-INVERT gate implemented using GaAs enhancement mode and depletion mode MESFETs in accordance with an illustrative embodiment of the invention.

Turning to FIG. 3, a gate is illustrated which successively performs an AND operation, an OR operation and an INVERT operation. More particulary, the circuit of FIG. 3 comprises two multiple input AND gates 40 and 50, followed by a multiple input OR gate 60. The OR gate 60 is followed by an inverter stage 70.

Illustratively, each of the multiple input AND gates comprises a depletion mode MESFET 42, 52 whose source is tied to its gate and whose drain is connected to the voltage supply $V_{DD}$. Each of the AND gates 40, 50 is adapted to receive multiple logic inputs. The AND gate 40 is adapted to receive the inputs B1, B2 . . . BN. The AND gate 50 is adapted to receive a logic inputs C1, C2 . . . CN. Each of the inputs to the AND gates 40, 50 has a Schottky barrier diode 43-1, 43-2 . . . 43-N, 53-1, 53-2 . . . 53-N diode associated with it. Each logic input B-1 . . . B-N, C-1 . . . C-N is connected to the cathode of its associated diode. The anode of the associate diode is connected to the source terminal of the respective depletion mode MESFET. The AND gates 40, 50 work as follows. In each AND gate, if any of the logical inputs are low (i.e., logic "0"), the corresponding diodes will be forward biased and the source terminal of the corresponding depletion mode load MESFET is pulled low (i.e., to about 0.6 Volts). On the other hand, if all of the logic inputs are high, all of the input diodes are reversed biased and the source terminal of the depletion mode MESFET is pulled up to $V_{DD}$.

As indicated above, the AND gate of the present invention is especially advantageous in that it is well suited for multiple inputs in excess of two and in that the Schottky barrier diodes utilized therein are minimum geometry components.

The outputs of the AND gates 40, 50 (which are taken at the respective source terminals of the MESFETS 42, 52) become the inputs to the OR gate 60. The OR gate 60 is source follower OR logic and performs exactly the same way as the source follower OR logic 10 described in connection with FIG. 1, except that a Schottky barrier diode 66 rather than a depletion mode MESFET is used for level shifting.

The inputs to the source follower OR logic 60 are received at the gates of the enhancement mode MESFETs 62, 64. If any of the inputs to the source follower OR logic 60 are high then the common source 65 is pulled up. If all of the input are low the common source terminal 65 is pulled down. The voltage signal at the common source terminal is level shifted using the Schottky barrier diode 66 when one of the enhancement mode MESFETs 62, 64 is conducting. The signal present at the cathode of the diode 66 is then used as the input to the driver FET 72 of the conventional inverter 70. The depletion mode MESFET 68 serves as a current source for discharging the gate of the driver MESFET 72. Note that in particular embodiments of the invention there may be more than two inputs FETs to the OR logic stage 60. Such input FETs may receive logic input signals from AND gates of the type 40, 50 or from other logic gates present in a particular circuit.

Complex Boolean functions may be implemented by combining gates of the type shown in FIG. 1 with gates of the type shown in FIG. 3. For such circuits to operate, it is desirable for the two types of gates to have the same noise margin. The transfer characteristics of the two gates are matched to create equal noise margins. More particularly, the dimensions of the level shifting MESFET 16 in the gate of FIG. 1 may be adjusted to insure that the NOR gate of FIG. 1 has the same noise margins as the AND-OR-INVERT gate of FIG. 3.

In short, a high performance logic family implemented using GaAs enhancement mode and depletion mode MESFETs is disclosed. The inventive logic family exhibits a large noise margin with little sacrifice in speed and power performance. The inventive logic family exhibits a voltage swing of about 90% of the supply voltage and with the use of push-pull output stages very little power is dissipated. Another important feature of the logic family is the multiple input AND gate.

Finally the above described embodiments of the invention are intended to be illustrative only. Numerous alternative embodiments may be derived by those skilled in the art without departing from the spirit or scope of the following claims.

I claim:

1. A multiple input logic gate for implementing the NOR function comprising:
    an input stage including a plurality of enhancement mode FETs, said enhancement mode FETs having gate terminals for receiving logical input signals and a common source terminal, said input stage further including a depletion mode FET which is capable of level shifting the voltage present at said common source terminal, and
    an inverter stage connected to said depletion mode FET, said depletion mode FET being coupled between said common source terminal and an input of said inverter stage.

2. The gate of claim 1 wherein said inverter stage is electrically connected to a push-pull stage comprising two enhancement mode FETs.

3. The gate of claim 2 wherein said push-pull stage is connected to an additional depletion mode FET.

4. The gate of claim 1 wherein said input stage is formed from GaAs enhancement mode MESFETs, said depletion mode FET is a GaAs MESFET, and said inverter stage comprises one enhancement mode GaAs MESFET and one depletion mode GaAs MESFET.

5. A logic gate capable of being implemented using GaAs enhancement mode and depletion mode MESFETs comprising:
    a source follower input stage comprising at least one enhancement mode FET having a drain terminal connected to a power supply, a gate terminal for receiving an input signal and a source terminal whose voltage is responsive to said input signal, said input stage further including a depletion mode FET capable of level shifting the voltage at said source terminal, and
    an inverter stage connected to said depletion mode FET and comprising an enhancement mode driver FET and a depletion mode load FET.

6. A logic gate capable of being implemented using GaAs enhancement mode and depletion mode MESFETs comprising
    a source following input stage comprising at least a first enhancement mode FET having a gate terminal for receiving a logic input signal, a drain terminal connected to a voltage supply, and a source terminal for producing a voltage signal responsive to said logic input signal, and a first depletion mode FET having a drain terminal connected to the source terminal of said first enhancement mode FET and a source terminal connected to a gate terminal, said first depletion mode FET being capable of level shifting said voltage produced at said source terminal of said first enhancement mode FET, and an inverter stage comprising a second enhancement mode FET and a second depletion mode FET, a gate terminal of said second enhancement mode FET being connected to the source terminal of said level shifting first depletion mode FET.

7. The logic gate of claim 6 wherein said gate further includes current supply means connected to the gate terminal of the second enhancement mode FET for discharging the gate terminal of said second enhancement mode FET.

8. The logic gate of claim 7 wherein said current supply means comprises a third depletion mode FET.

9. A logic gate comprising:
at least one stage for performing the AND function including a depletion mode FET having gate, drain and source terminals, said drain terminal being capable of connection to a voltage supply and said gate terminal being connected to said source terminal, and a plurality of diodes, each diode having an anode and a cathode, each of said anodes being connected to said source terminal and each of said cathodes being capable of receiving a logic input signal, a stage for performing the OR function including at least one enhancement mode FET having a gate terminal connected to said source terminal of said depletion mode FET in said AND stage and a source terminal, and a diode which is capable of level shifting the voltage present at said source terminal of said enhancement mode FET, and an inverter stage connected to said diode.

10. The gate of claim 9 wherein said FETs are GaAs MESFETS and said diodes are Schottky barrier diodes.

11. A GaAs solid stage circuit comprising,
first and second interconnected logic gates capable of performing distinct Boolean functions,
said first gate including a level shifting Schottky barrier diode,
said second gate including a level shifting depletion mode MESFET dimensioned for providing said second gate with a noise margin that substantially matches the noise margin of said first gate.

12. The circuit of claim 11 wherein said first gate is capable of performing the AND-OR-INVERT function and said second gate is capable of performing the NOR function.

* * * * *